(12) United States Patent
Coustier et al.

(10) Patent No.: US 12,275,221 B2
(45) Date of Patent: Apr. 15, 2025

(54) METHOD FOR DISASSEMBLING A PHOTOVOLTAIC MODULE AND ASSOCIATED INSTALLATION

(71) Applicant: COMMISSARIAT A L'ENERGIE ATOMIQUE ET AUX ENERGIES ALTERNATIVES, Paris (FR)

(72) Inventors: Fabrice Coustier, Chambery (FR); Paul Messaoudi, Saint-Alban Leysse (FR); Marion Serasset, Saint Paul sur Yenne (FR); Nicolas Velet, Vezeronce-Curtin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 981 days.

(21) Appl. No.: 16/642,192

(22) PCT Filed: Aug. 28, 2018

(86) PCT No.: PCT/FR2018/052113
§ 371 (c)(1),
(2) Date: Feb. 26, 2020

(87) PCT Pub. No.: WO2019/043329
PCT Pub. Date: Mar. 7, 2019

(65) Prior Publication Data
US 2020/0198316 A1    Jun. 25, 2020

(30) Foreign Application Priority Data
Aug. 30, 2017  (FR) ...................................... 1758010

(51) Int. Cl.
*B32B 43/00*    (2006.01)
*B26D 1/00*    (2006.01)
(Continued)

(52) U.S. Cl.
CPC .......... *B32B 43/006* (2013.01); *B26D 1/0006* (2013.01); *B26D 1/5475* (2013.01);
(Continued)

(58) Field of Classification Search
CPC . B32B 43/006; B32B 43/003; B32B 2457/12; B32B 2309/105; B26D 1/006;
(Continued)

(56) References Cited

U.S. PATENT DOCUMENTS 4,367,665 A * 1/1983 Terpstra ............... B23D 59/006
83/167
2004/0171187 A1* 9/2004 Kataoka .................. H01L 31/18
136/251
(Continued)

FOREIGN PATENT DOCUMENTS

CN    103085116 A    5/2013
DE    195 39 699 A1    4/1997
(Continued)

OTHER PUBLICATIONS

MC Machinery Systems, Inc. "Mitsubishi VZ10 3D Laser Cutting Systems" Uploaded to YouTube on Jul. 8, 2011. Accessed Jul. 15, 2023 at <https://www.youtube.com/watch?v=5Hp_DPEapzg> (Year: 2011).*
(Continued)

*Primary Examiner* — Alex B Efta
*Assistant Examiner* — Alexander S Wright
(74) *Attorney, Agent, or Firm* — Oblon, McClelland, Maier & Neustadt, L.L.P.

(57) ABSTRACT

A photovoltaic module includes a first protective element, a second protective element, photovoltaic cells that are located between the first protective element and the second protective element, an envelope in which the photovoltaic cells are encapsulated. The envelope links the first protective
(Continued)

element to the second protective element and includes a first portion that is located between the photovoltaic cells and the first protective element, and a second portion that is located between the photovoltaic cells and the second protective element. The disassembly method includes separating the photovoltaic cells with respect to the first protective element and cutting the first portion of the envelope by an abrasive wire.

18 Claims, 6 Drawing Sheets

(51) Int. Cl.
  *B26D 1/547* (2006.01)
  *B26D 3/28* (2006.01)
  *H01L 31/048* (2014.01)
  *H01L 31/18* (2006.01)
  *H02S 40/20* (2014.01)

(52) U.S. Cl.
  CPC ............ *B26D 3/281* (2013.01); *B32B 43/003* (2013.01); *H01L 31/048* (2013.01); *H01L 31/1876* (2013.01); *H02S 40/20* (2014.12); *B26D 2001/008* (2013.01); *B32B 2457/12* (2013.01)

(58) Field of Classification Search
  CPC ........ B26D 1/5475; B26D 3/281; B26D 3/28; B26D 2001/008; H01L 31/048; H01L 31/1876; H02S 40/20; B26F 3/12; Y02E 10/50; Y02P 70/50
  See application file for complete search history.

(56) References Cited

U.S. PATENT DOCUMENTS

| | | |
|---|---|---|
| 2005/0051204 A1 | 3/2005 | Oi et al. |
| 2008/0105294 A1* | 5/2008 | Kushiya ................ H01L 31/048 156/332 |
| 2010/0197202 A1 | 8/2010 | Branagan et al. |
| 2011/0183442 A1* | 7/2011 | Oi .......................... H01L 31/048 438/4 |
| 2012/0272944 A1* | 11/2012 | Coustier ................ B28D 5/045 125/35 |

FOREIGN PATENT DOCUMENTS

| | | |
|---|---|---|
| EP | 1 820 411 A1 | 9/2007 |
| EP | 3 098 008 A1 | 11/2016 |
| FR | 3 017 551 A1 | 8/2015 |
| JP | 2009-214058 A | 9/2009 |
| JP | 2015-110201 A | 8/2015 |
| WO | WO 2015/051977 A1 | 4/2015 |

OTHER PUBLICATIONS

International Search Report issued on Nov. 22, 2018 in PCT/FR2018/052115 filed on Aug. 28, 2018, 3 pages.

French Preliminary Search Report issued on Apr. 23, 2018 in French Application 17580100 filed on Aug. 30, 2017, 2 pages.

Goris, M.A. A. et al., "Production of Recyclable Crystalline SI PV Modules," 31st European Photovoltaic Solar Energy Conference and Exhibition, session 5, EO, Jan. 2, 2015, 5 total pages.

* cited by examiner

METHOD FOR DISASSEMBLING A PHOTOVOLTAIC MODULE AND ASSOCIATED INSTALLATION

FIELD OF THE INVENTION

The field of the invention concerns the disassembling of a photovoltaic module, notably when the photovoltaic module reaches the end of its life, or when the photovoltaic module is a production reject.

PRIOR ART

Photovoltaic modules are used to generate electricity from solar radiation. A photovoltaic module comprises a number of useful elements to be recovered, notably in the context of recycling the photovoltaic module at the end of its life or in the event of a failure of the photovoltaic module. The photovoltaic module can comprise an envelope in which photovoltaic cells are encapsulated, which also provides mechanical support for a front protective element of the photovoltaic module, such as a glass plate or panel, with a rear protective element of the photovoltaic module such as a protective sheet also referred to as a rear protective sheet. The protective sheet can comprise a fluorinated polymer such as a poly(vinyl fluoride)—also referred to as polyvinyl fluoride—the abbreviation of which is PVF. The PVF can be Tedlar®, as marketed by the company DuPont™.

A simple technique used in order to recycle a photovoltaic module is to grind it, and then carry out thermal or chemical treatments in order to separate certain materials used in its composition, such as glass or noble metals like silver or copper, for example. One disadvantage of this technique is that it is not very environmentally friendly. Furthermore, another disadvantage of this technique is that it is energy intensive. Yet another disadvantage of this technique is that the increase in temperature of the material of the described rear protective sheet can result in significant emissions of toxic pollutants from the fluorinated polymer. Yet another disadvantage of this technique is that it does not allow one or more constituents of the photovoltaic module to be recovered intact, or largely intact.

Patent application CN103085116 proposes the use of a heating wire passing through a material encapsulating photovoltaic cells, this encapsulating material being ethylene-vinyl acetate. Using a heating wire has the following disadvantages:
- the heat that needs to be provided results in the consumption of heat energy, which has a certain cost,
- there is a high chance of the heating wire breaking due to its temperature and the stresses that it undergoes as it passes through the encapsulating material,
- such a use is not suitable for a photovoltaic module comprising a protective sheet comprising a fluorinated polymer because the increase in temperature can result in significant toxic gas emissions.

The document "Production of Recyclable crystalline Si PV Modules" by M. A. A. Goris et al. published in 2015 at the "31st European Photovoltaic Solar Energy Conference and Exhibition", session 5 EO.1.2 p 925-1929, proposes the use of a cutting wire combined with the heating of the photovoltaic module to separate photovoltaic cells with respect to a glass panel of the photovoltaic module. Although the wire combined with the increase in temperature of the photovoltaic module helps facilitate the separation of different elements of the photovoltaic module, such an increase in temperature has the disadvantage of resulting in non-negligible energy consumption. Another disadvantage of the solution described in this document is that it is not suitable for a photovoltaic module with a rear protective element comprising a fluorinated polymer because of the risk of toxic gases being released when it is removed as a result of the photovoltaic module being heated.

Patent application FR3017551 proposes to remove a rear sheet from a photovoltaic module by winding, said rear sheet comprising polyvinyl fluoride. The removal is assisted by heating the photovoltaic module. The proposed removal has the disadvantage of requiring a sizeable amount of heat to be applied to the photovoltaic module, which comes at a cost and can result in toxic gases being released from the polyvinyl fluoride.

Purpose of the Invention

The aim of the invention is to at least partially overcome the disadvantages of the prior art.

For this purpose, the subject of the invention is a method for disassembling a photovoltaic module comprising:
- a first protective element,
- a second protective element,
- photovoltaic cells that are located between the first protective element and the second protective element,
- an envelope in which the photovoltaic cells are encapsulated, said envelope linking the first protective element to the second protective element and comprising:
  - a first portion that is located between the photovoltaic cells and the first protective element, and
  - a second portion that is located between the photovoltaic cells and the second protective element, said disassembly method comprising a step of separating the photovoltaic cells with respect to the first protective element, this disassembly method being characterized in that the step of separating the photovoltaic cells with respect to the first protective element comprises a step of cutting the first portion of the envelope by means of an abrasive wire.

The disassembly method can comprise one or more of the following features:
- the step of cutting the first portion of the envelope by means of the abrasive wire is carried out in dry conditions;
- the disassembly method comprises a step of separating the photovoltaic cells with respect to the second protective element, comprising a step of cutting the second portion of the envelope,
- the step of cutting the second portion of the envelope is implemented by said abrasive wire or by an additional abrasive wire;
- the first protective element comprising rims in contact with lateral edges of the first portion of the envelope, the disassembly method comprises a step of removing the rims from the first protective element, the step of cutting the first portion of the envelope being implemented after the step of removing the rims;
- the step of removing the rims comprises:
  - a step of forming a notch in the photovoltaic module from an outer face of the first protective element so as to delimit a frame comprising the rims,
  - a step of cutting into the lateral faces of the photovoltaic module up to the notch in order to detach the frame from the photovoltaic module;
- the step of forming the notch and the step of cutting into the lateral faces of the photovoltaic module are carried out by abeam of energetic particles originating from a cutting head;

during the step of cutting into the lateral feces, of the photovoltaic module, the cutting head is guided by using data from a guiding system comprising an optical vision system, or a material detector;

during the step of cutting into the lateral faces of the photovoltaic module, an action is exerted on the frame by a gripping member so as to move said frame away from the photovoltaic cells;

the step of separating the photovoltaic cells with respect to the first protective element comprise a step of applying a force to the first protective element, said force application step gradually moving said first protective element away from the photovoltaic cells, during the step of cutting said first portion of the envelope, as the abrasive wire progresses through the first portion of the envelope;

the disassembly method comprises a step of cooling the photovoltaic module, and the step of cutting the first portion of the envelope by means of the abrasive wire is carried out during the step of cooling the photovoltaic module;

one of the first and second protective elements is held flat during the implementation of the step of cutting the first portion of the envelope.

The invention also concerns an installation for disassembling a photovoltaic module, said photovoltaic module comprising a first protective element, a second protective element, photovoltaic cells that are located between the first protective element and the second protective element, an envelope in which the photovoltaic cells are encapsulated, said envelope linking the first protective element to the second protective element and comprising:

a first portion that is located between the photovoltaic cells and the first protective element, and a second portion that is located between the photovoltaic cells and the second protective element, said installation comprising a cutting station for cutting the photovoltaic module comprising a cutting tool provided with a wire, said installation being characterized in that the wire is an abrasive wire arranged so as to allow the first portion of the envelope to be cut, preferably in dry conditions, in order to separate the photovoltaic cells with respect to the first protective element.

The installation can comprise a modification station for modifying the photovoltaic module before it enters the cutting station, said modification station comprising a cutting head capable of moving to allow the photovoltaic module to be cut in order to remove rims from the first protective element in contact with lateral edges of the first portion of the envelope.

BRIEF DESCRIPTION OF THE DRAWINGS

Other advantages and features will be clearly understood upon reading the following description of specific embodiments of the invention provided as non-limiting examples and shown in the appended drawings, in which.

In these figures, the same references are used to denote the same elements.

Moreover, the elements shown in the figures are not necessarily drawn to scale to facilitate understanding of the figures.

DESCRIPTION OF SPECIFIC EMBODIMENTS

In the present description, "-based" should be understood to mean "at least mainly comprising".

Figure 1:
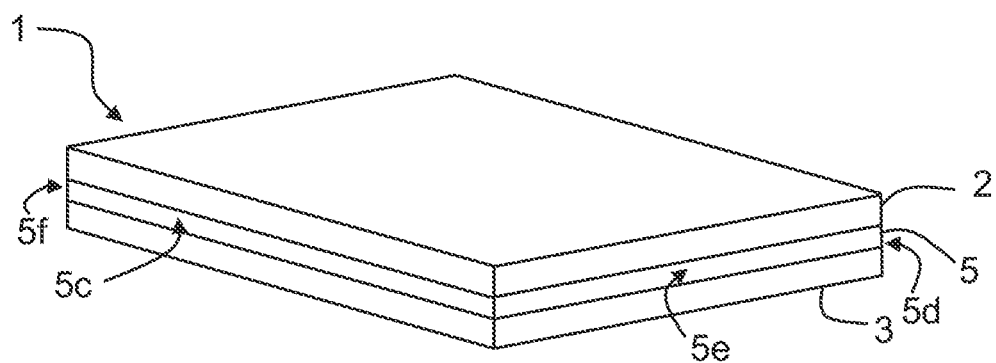
FIG. 1 illustrates a photovoltaic module according to a first embodiment.
Figure 2:
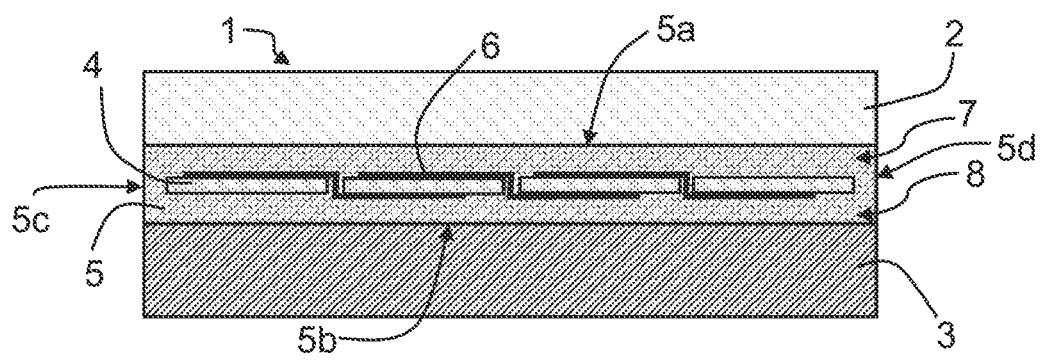
FIG. 2 illustrates a cross section view of the photovoltaic module of FIG. 1.
Figure 3:
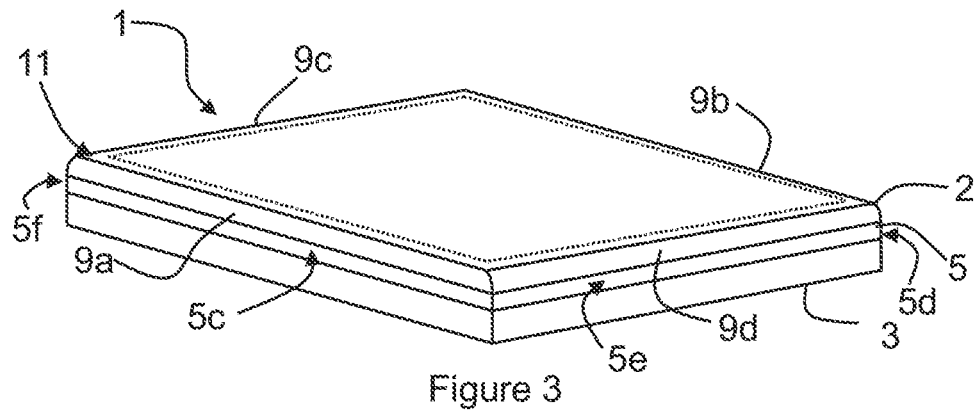
FIG. 3 illustrates a photovoltaic module according to a second embodiment.
Figure 4:
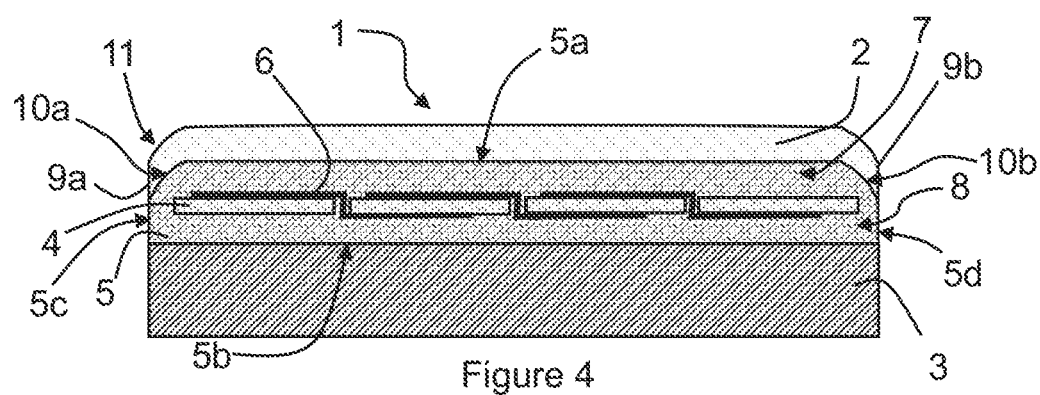
FIG. 4 illustrates a cross section view of the photovoltaic module of FIG. 3.

FIGS. 1 to 4 illustrate two embodiments of a photovoltaic module 1 that can be used in the context of the disassembly method and of the disassembly installation described in greater detail below Generally, the photovoltaic module 1 can comprise a first protective element 2, a second protective element 3, photovoltaic cells 4, and one or more encapsulating materials forming an envelope 5 in which the photovoltaic cells 4 are encapsulated. Hereinafter, the envelope 5 represents the envelope in which the photovoltaic cells 4 are encapsulated. In FIGS. 2 and 4, for example, four photovoltaic cells 4 can be seen. The photovoltaic cells 4 of the photovoltaic module 1 are arranged notably in the same plane so as to form a framework of photovoltaic cells 4 also referred to as a "string", which are notably connected together electrically in series by connectors 6. The photovoltaic cells 4 are located between the first and second protective elements 2, 3. The envelope 5 links the first protective element 2 to the second protective element 3. The envelope 5 comprises a first portion 7 that is located between the photovoltaic cells 4 and the first protective element 2. The envelope 5 comprises; a second portion 8 that is located between the photovoltaic cells 4 and the second protective element 3. The envelope 5 helps, on the one hand, protect the photovoltaic cells 4 from the outside environment by encapsulating them, and, on the other hand, ensure the joining of the first protective element 2 to the second protective element 3, and thus ensure the assembling of the photovoltaic cells 4 with these first and second protective elements 2, 3. The envelope 5 can therefore comprise (FIGS. 2 and 4) a first main face 5a and a second main face 5b that are fixed respectively to the first protective element 2 and to the second protective element 3. The first main face 5a is opposite the second main face 5b. The envelope 5 also comprises lateral edges 5c, 5d, 5e, 5f, notably four lateral edges, each of which links the first main face 5a to the second main face 5b. During the manufacture of the photovoltaic module 1 lit is possible to make a stack that comprises, successively, the first protective element 2, at least one sheet made from a material intended to encapsulate the photovoltaic cells 4 referred to as encapsulating material, the photovoltaic cells 4, preferably at least one other sheet made from a material intended to encapsulate the photovoltaic cells 4 referred to as encapsulating material, then the second protective element 3. The stack is then hot-rolled such that the encapsulating material or materials fuse together and form the envelope 5, thus producing the above-mentioned structure of the photovoltaic module 1.

In the present description, "protective element" should be understood to mean an element that can have a stiffening function and/or a surface protection function notably, one of the first and second protective elements 2, 3 forms a front face of the photovoltaic module 1, and the other of the first and second protective elements 2, 3 forms a rear face of, the photovoltaic module 1 opposite the front face of the photovoltaic module 1. The first and second protective elements 2, 3 can therefore form external faces of the photovoltaic module 1. The front face of the photovoltaic module 1 is intended to be oriented so as to receive solar radiation in order to allow solar energy to be converted into electricity by the photovoltaic cells 4 of the photovoltaic module 1. For example, the corresponding protective element can, if appropriate, provide protection against ultraviolet radiation and impermeability to gases and water. Moreover, the protective element can, if appropriate, act as electrical protection (electrical insulation), as mechanical protection and as a barrier to moisture.

FIGS. 1 and 2 illustrate a first embodiment of the photovoltaic module 1 in which the first and second protective elements 2, 3 allow light to pass through; they can be made from glass. The first and second protective elements 2, 3 can be layers, plates or panels, which are notably made from glass or glass-based. This photovoltaic module 1 structure is also known as a double-glass or bifacial module. The first and second protective elements 2, 3 can, in this instance, notably in addition to transmitting solar radiation, perform a function of stiffening and protecting against external attacks, such as hail for example, a function of gas and water impermeability, a function of protection against ultraviolet and an electrical protection (electrical insulation) function.

FIGS. 3 and 4 illustrate a second embodiment of the photovoltaic module 1. This embodiment is a monofacial module, in which only one of the first and second protective elements 2, 3 allows light to pass through. In this instance, the second protective element 3, which is, notably, made from glass, allows light to pass through, and can be a layer, a plate or a panel, which is, notably, made from glass or glass-based. The second protective element 3 forms the front face of the photovoltaic module 1. The first protective element 2 forms the rear face of the photovoltaic module 1. The first protective element 2 is also referred to as a "backsheet".

In FIGS. 3 and 4, the second protective element 3 can, in addition to transmitting solar radiation, perform a function of stiffening and protecting against external attacks, such as hail for example, a function of gas and water impermeability, a function of protection against ultraviolet and an electrical protection (electrical insulation) function. The first protective element 2 can, in this instance, provide protection against temperature variations, corrosive atmospheres, moisture and salt. The first protective element 2 can also perform a function of gas and water impermeability, an electrical protection (electrical insulation) function, and a mechanical protection function. The first protective element 2 can comprise a fluorinated polymer, notably a poly(vinyl fluoride) (the abbreviation of which is PVF), for example as marketed as Tedlar® by the company DuPont™. Notably, the first protective element 2 can comprise a stack of the following layers: a layer of PVF, a layer of polyethylene terephthalate (the abbreviation of which is PET), a layer of PVF. The layer of PET is arranged between the layers of PVF. Notably, the layers of PVF make it possible to form a barrier to moisture, and the layer of PET makes it possible to form an electrical protection (electrical insulation). Notably, the first protective element 2 can assume the shape of a sheet comprising, for example, the stack of layers described above. The first protective element 2 can be sufficiently flexible to allow it to be wound around itself when it is separated from the photovoltaic module 1.

According to this second embodiment of the photovoltaic module 1, the first protective element 2 comprises rims 9a, 9b, 9c, 9d in contact with the envelope 5, notably with edges referred to as lateral edges 10a, 10b (FIG. 4) of the first portion 7 of the envelope 5. These rims 9a, 9b, 9c, 9d and also the lateral edges 10a, 10b of the first portion 7 of the envelope 5 can be at least partially rounded as a result of the hot rolling mentioned above for forming the photovoltaic module 1. In particular, the first protective element 2 comprises four rims 9a, 9b, 9c, 9d each in contact with a corresponding lateral edge 10a, 10b of the first portion 7 of the envelope 5. The rims 9a, 9b, 9c, 9d form a contour 11 (one boundary of which is represented by the dotted lines in FIG. 3), or a border, of the first protective element 2. The presence of these rims 9a, 9b, 9c, 9d is: notably, the consequence of the hot rolling mentioned previously. The lateral edges 10a, 10b of the first portion 7 of the envelope 5 are edges that extend from the first main face 5a of the envelope 5 towards the second main face 5b of the envelope 5: the lateral edges 10a, 10b of the first portion 7 of the envelope 5 form a part of the lateral edges of the envelope 5.

Generally, the envelope 5 can comprise ethylene-vinyl acetate (the abbreviation of which is EVA), or more particularly be ethylene-vinyl acetate-based.

Notably, the first portion 7 of the envelope 5 and the second portion 8 of the envelope 5 can each have a thickness of between 100 µm and 400 µm, and notably strictly less than 300 µm or 200 µm. The thickness is in this case measured respectively between the photovoltaic cells 4 and the first protective element 2 for the first portion 7 of the envelope 5, and between the photovoltaic cells 4 and the second protective element 3 for the second portion 8 of the envelope 5.

Conventionally, a photovoltaic module can also comprise a protective frame made from aluminum or another material (not shown) enclosing the opposing faces of the first and second protective elements. In the disassembly method described hereinafter, the photovoltaic module does not comprise this protective frame, which may have been removed in advance. The photovoltaic module can also be associated with a junction box that is also removed before disassembling the photovoltaic module according to the disassembly method described hereinafter.

Figure 5:
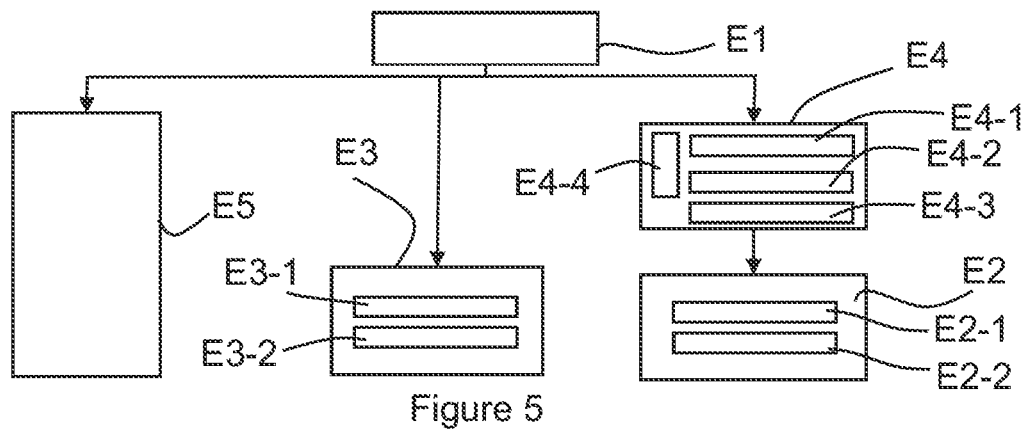
FIG. 5 illustrates, schematically, steps of a method for disassembling the photovoltaic module.
Figure 6:
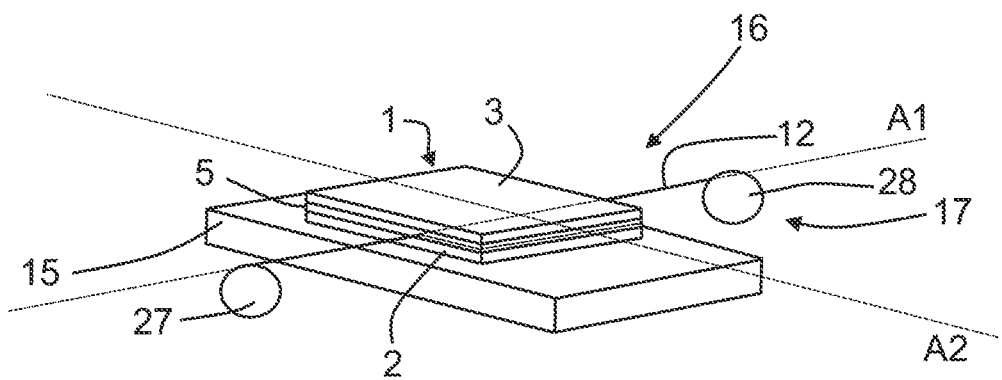
FIGS. 6 and 7 respectively illustrate according to a perspective view and according to a cross section view of said perspective view, a step of cutting the photovoltaic module according to its first embodiment by means of abrasive wire.
Figure 7:
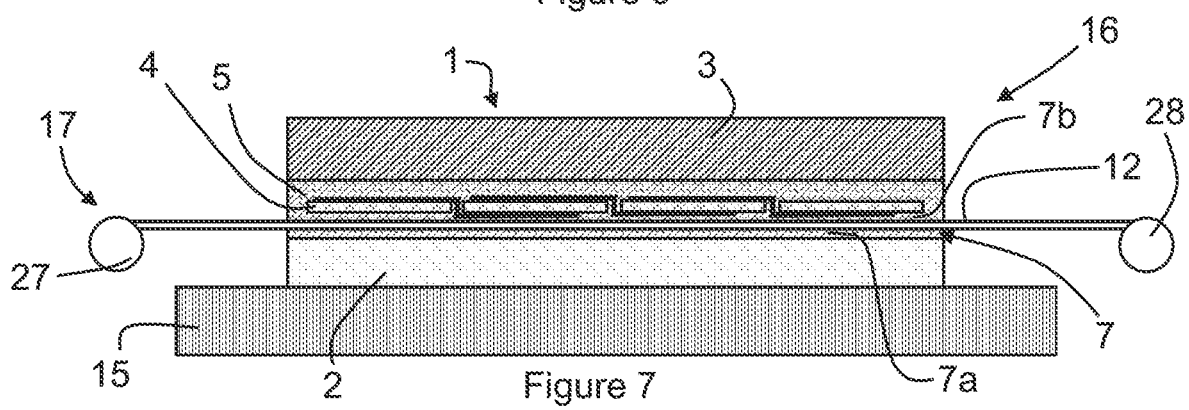

As illustrated, for example, in FIGS. 5 to 7, the method for disassembling the photovoltaic module 1 advantageously comprises a step E1 of providing the photovoltaic module 1 as described previously. If appropriate, it is understood that all the steps implemented during the disassembly method are implemented on the provided photovoltaic module 1. Moreover, such a disassembly method comprises a step E2 of separating the photovoltaic cells 4 with respect to the first protective element 2. The separation step E2 comprises a step E2-1 of cutting the first portion 7 of the envelope 5 by means of an abrasive wire 12. The separation step E2 is such that, notably, at the end of the step E2-1 of cutting the first portion 7 of the envelope 5, the photovoltaic cells 4, linked to the first protective element 2 by the first portion 7 of the envelope 5 before the separation step E2, are separated (i.e. disassembled) from the first protective element 2. In fact, the step E2-1 of cutting by means of the abrasive wire 12 implements reciprocating movements of the abrasive wire 12 along a longitudinal axis A1, and a relative movement between the abrasive wire 12 and the photovoltaic module 1 (along the axis A2 which is preferably orthogonal to, or forming a non-zero angle with, the axis A1).

Figure 8:
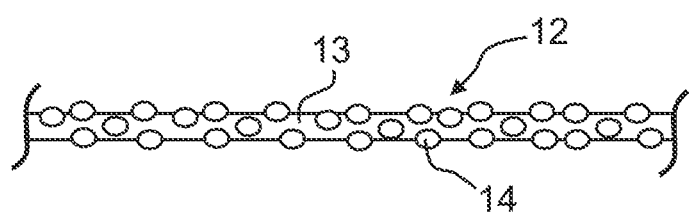
FIG. 8 illustrates, schematically, a section of an abrasive wire.

The step E2-1 of cutting using the abrasive wire 12 saws the first portion 7 of the envelope 5 between the first protective element 2 and the photovoltaic cells 4. Using the abrasive wire 12 for cutting has the advantage of limiting the increase in temperature of the photovoltaic module 1, due to sawing, at the location where the cutting is carried out rather than coupling a simple wire to a heating system, which involves a greater increase in temperature. Moreover, the use of the abrasive wire 12 limits the risk of the material from the envelope 5 sticking back to itself as the abrasive wire 12 passes through the first portion 7 of the envelope 5. Moreover, there is less of a risk of such an abrasive wire 12 breaking than a heating wire; in particular because the abrasive wire 12 can be renewed over the course of the reciprocating movements by feeding in new wire as described below. Furthermore, with the abrasive wire 12, there is no need to increase the temperature of the photovoltaic module 1 to carry out the cutting operation. The abrasive wire 12, as illustrated in FIG. 8, comprises a support wire 13, also referred to as a central core, to which abrasive particles 14 are fixed, represented schematically by oval elements in FIG. 8. The support wire 13 can be made from steel, for example. In another version, the abrasive wire 12 is formed of abrasive particles held onto the central core of the abrasive wire 12 by a binder. In the context of the abrasive wire 12, the abrasive particles are preferably made from diamond, in other words, the abrasive wire 12 can be a diamond wire. FIGS. 6 and 7 illustrate, for example, the photovoltaic module 1 according to the first embodiment of the photovoltaic module, the first protective element 2 of which is in contact with a support 15, naturally it is also possible to use the photovoltaic module according to its second embodiment, notably in which the second protective element is in contact with the support, as described below.

An abrasive wire, notably a diamond wire, is generally used to cut hard materials such as sapphire, silicon carbide (SiC), silicon nitride ($Si_3N_4$), silicon (Si). Hard materials are, by nature, fragile and brittle. Thus, the abrasive particles of the abrasive wire penetrate the material to be cut such that the abrasive particles of the abrasive wire tear off chips of material by flaking or indentation. Moreover, conventional use of the abrasive wire requires the presence of a cutting fluid at the point of contact between the abrasive wire and the material to be cut. The cutting fluid is a cooling liquid and a lubricant that helps eliminate the flakes and clean the abrasive wire. Moreover, the cutting fluid can also be an antioxidant.

The material to be cut in the context of the photovoltaic module 1 is an encapsulating material forming the envelope 5; it does not have the usual characteristics of the materials generally cut by abrasive wire, notably diamond wire. This material to be cut can comprise EVA, or be EVA-based. Surprisingly, the material or materials of the envelope 5, while not having the usual hardness characteristics of the materials cut by an abrasive wire (the hardness of EVA is strictly less than that of silicon or SiC), can be cut effectively by the abrasive wire 12, notably without applying external heat.

Even more surprisingly, cutting the first portion 7 of the envelope 5 by means of the abrasive wire 12 without using cutting fluid provides better results than when cutting fluid is used. Indeed, it has been observed that adding cutting fluid increases the deflection (i.e. the amplitude of deformation) of the abrasive wire 12 when cutting the first portion 7 of the envelope 5, which can cause the abrasive wire 12 to break due to significant stresses experienced by the abrasive wire 12. Without cutting fluid, and in cutting conditions similar to those used for cutting with cutting fluid, the deflection of the abrasive wire 12 remains stable over time, meaning that the abrasive wire 12 cuts the first portion 7 of the envelope 5 evenly. In other words, the step E2-1 of cutting the first portion 7 of the envelope 5 by means of the abrasive wire 12 can be carried out in dry conditions (i.e. without cutting fluid).

Nevertheless, it is possible to use a cooling fluid to carry out intermittent lubrication so as to cool the first portion 7 of the envelope 5 in contact with the abrasive wire 12. Indeed, the first portion 7 of the envelope 5 heats up locally as the abrasive wire 12 passes through. In the vicinity of certain heat-conducting materials, such as copper strips forming, for example, the abovementioned connectors, light lubrication helps limit the formation of sparks. Light lubrication should be understood to mean drip lubrication, for example on the basis of one drop per second, and the lubrication can be carried out cut using water, or water with additives, to dean and cool the abrasive wire.

The invention also concerns an installation for disassembling the photovoltaic module 1 as described. At least part of the installation is illustrated schematically in FIGS. 6 and 7. Such an installation comprises a cutting station 16 for cutting the photovoltaic module 1 comprising a cutting tool 17 provided with the abrasive wire 12 arranged so as to allow the first portion 7 of the envelope 5 to be cut, notably in dry conditions, in order to separate the photovoltaic cells 4 with respect to the first protective element 2. The installation can also comprise the support 15 on which the photovoltaic module 1 is positioned during the separation step E2, in the cutting station 16, the height of the abrasive wire 12 with respect to the support 15 is calculated so as to allow desired cutting of the first portion 7 of the envelope 5 when, if appropriate, the first protective element or the second protective element is resting on the support 15. In the cutting station 16, the support 15 can move while the cutting tool 17 remains stationary, notwithstanding the movement of the abrasive wire 12 that makes cutting possible. Alternatively, it is the cutting tool 17 that moves in the cutting station 16 while the photovoltaic module 1 remains stationary in the cutting station 16. Thus, the installation can be configured to implement a relative movement between the support 15 and the cutting tool 17 when cutting the first portion 7 of the envelope 5. The advantages linked to such a disassembly installation result from those linked to the disassembly method.

Figure 11:
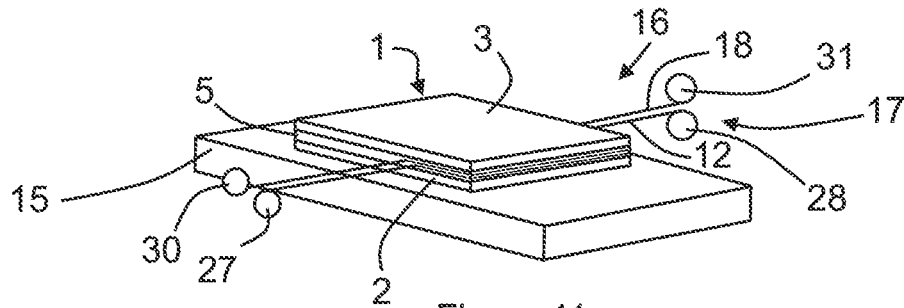
FIGS. 11 and 12 respectively illustrate according to a perspective view and according to a cross section view of said perspective view, steps of cutting the photovoltaic module according to its first embodiment by means of abrasive wires.
Figure 12:
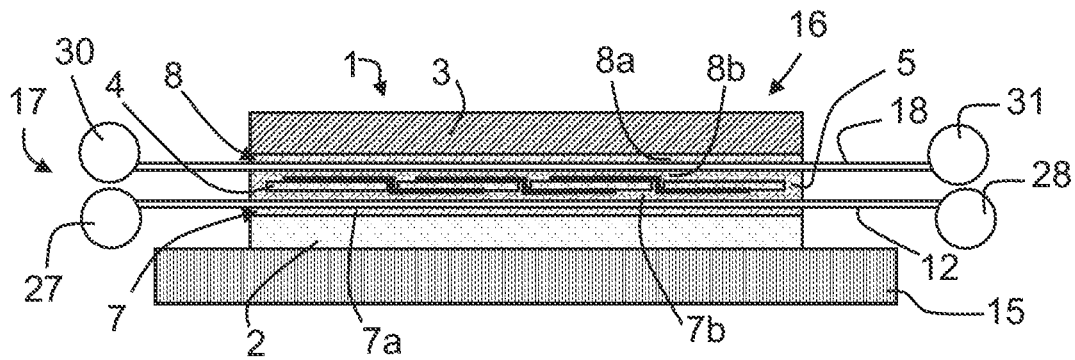

According to one embodiment, the disassembly method can also comprise a step E3 of separating the photovoltaic cells 4 with respect to the second protective element 3. Said separation step E3 comprises a step E3-1 (FIGS. 5 and 9 to 12) of cutting the second portion 8 of the envelope 5. The separation step E3 is such that, notably, at the end of the cutting step E3-1, the photovoltaic cells 4, linked to the second protective element 3 by the second portion 8 of the envelope 5 before the separation step E3, are separated (disassembled) from the second protective element 3. This step E3-1 of cutting the second portion 8 of the envelope 5 can be implemented by said abrasive wire 12 (FIGS. 9 and 10), or by an additional abrasive wire 18 (FIGS. 11 and 12). Therefore, it is advantageously possible to separate the photovoltaic module 1 into at least three portions respectively comprising the first protective element 2, the photovoltaic cells 4 and the second protective element 3 which can then each be recycled separately, rather than being ground up according to the prior art.

Figure 9:
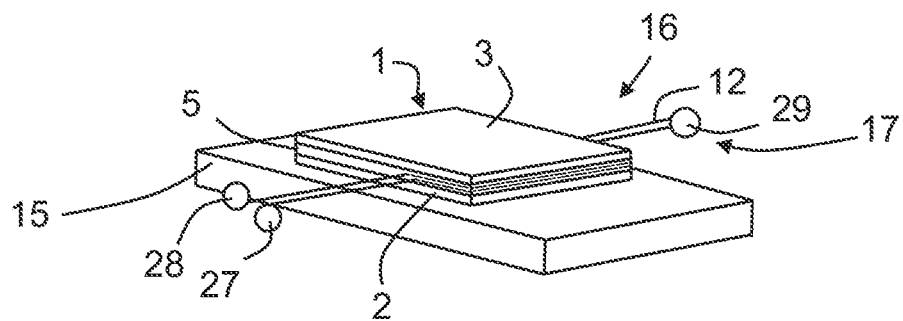
FIGS. 9 and 10 respectively illustrate according to a perspective view and according to a cross section view of said perspective view, steps of cutting the photovoltaic module according to its first embodiment by means of abrasive wire.
Figure 10:
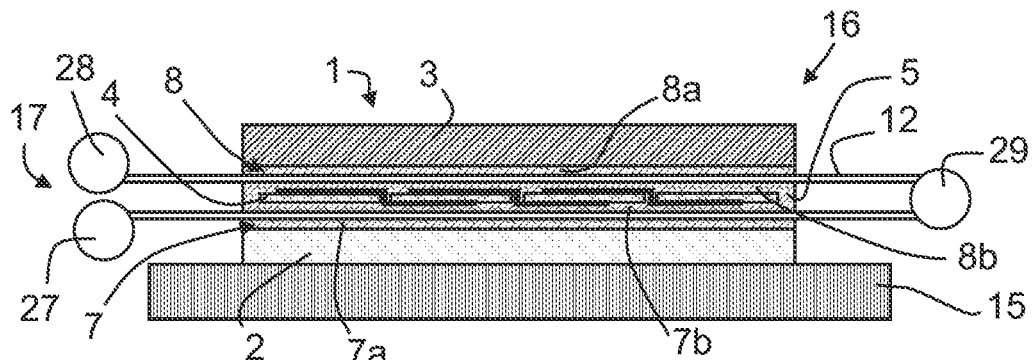

In FIGS. 9 and 10, the cutting tool 17 of the cutting station 16 comprises a single abrasive wire 12 that cuts the first and second portions 7, 8 of the envelope 5, notably simultaneously. In FIGS. 11 and 12, the cutting tool 17 of the cutting station 16 comprises two separate abrasive wires 12, 18, one of the two abrasive wires 12 cutting the first portion 7 of the envelope 5, and the other of the two abrasive wires 18 cutting the second portion 8 of the envelope 5.

What applies to the abrasive wire 12 can also apply to the additional abrasive wire 18. Notably, the cutting steps E2-1 and E3-1 are carried out in dry conditions. It is preferable to use a single abrasive wire 12 to carry out the cutting steps E2-1 and E3-1 to limit the costs linked to the use of two abrasive wires. Everything that can apply to the cutting of the first portion 7 of the envelope 5 by means of the abrasive wire 12 can also apply to the cutting of the second portion 8 of the envelope 5 by means of an abrasive wire, which may or may not be an additional abrasive wire. Using two abrasive wires is not preferable because it makes the cutting tool 17 more complex and therefore increases the cost of the cutting tool 17. Using two abrasive wires can be beneficial if the first and second portions 7, 8 of the envelope 5 are made from different materials. Preferably, the first and second portions 7, 8 of the envelope 5 are made from the same material, and the use of a single abrasive wire 12 is therefore preferred for carrying out the cutting steps E2-1 and E3-1.

As illustrated in FIGS. 9 to 12, the photovoltaic module 1 according to the first embodiment of the photovoltaic module makes it possible to separate, if appropriate, two panels (which are, notably, made from glass or glass-based), respectively forming the first and second protective elements 2, 3, with respect to the photovoltaic cells 4.

Figure 13:
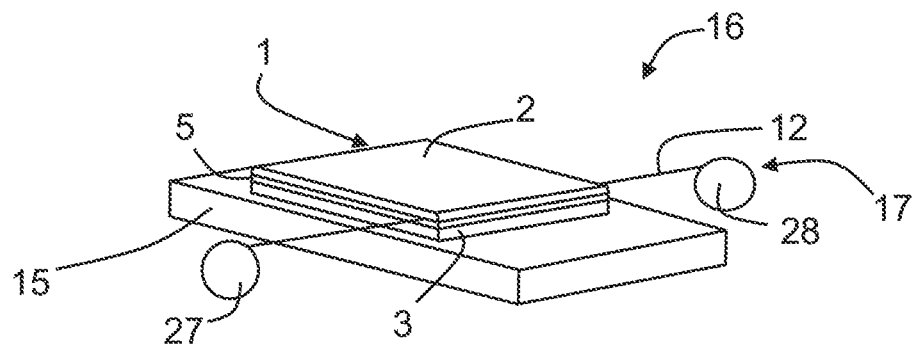
FIGS. 13 and 14 respectively illustrate according to a perspective view and according to a cross section view of said perspective view, a step of cutting the photovoltaic module according to its second embodiment by means of abrasive wire.
Figure 14:
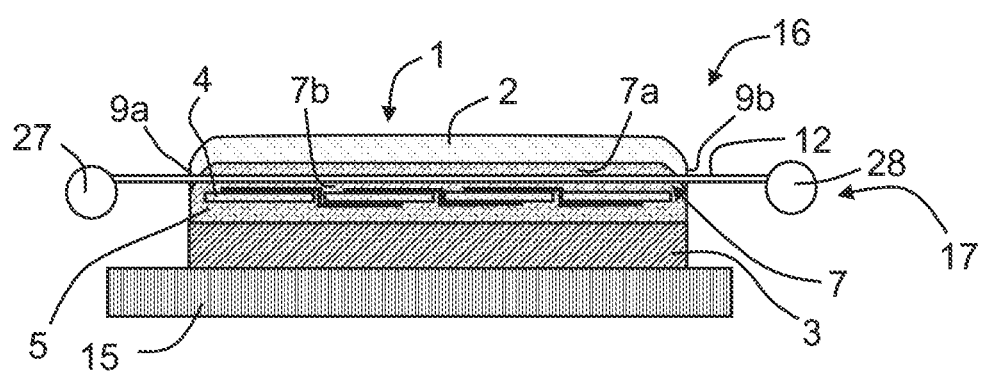

FIGS. 13 and 14 illustrate the step E2-1 of cutting the first portion 7 of the envelope 5 described above in the case of the photovoltaic module 1 according to its second embodiment. It is understood that the rims 9a, 9b (FIG. 14) of the first protective element 2 will be located in the path of the abrasive wire 12 during the corresponding cutting, since the abrasive wire 12 cuts in a horizontal plane. Thus, the abrasive wire 12 cannot bypass the rims 9a, 9b, 9c, 9d (FIG. 3), which can make cutting more difficult, or even cause the abrasive wire 12 to break. In FIGS. 13 and 14, the second protective element 3 rests on the support 15.

Thus, according to a specific embodiment, the disassembly method can comprise a step E4 (FIG. 5) of removing the rims 9a, 9b, 9c, 9d from the first protective element 2, making it easier for the abrasive wire 12 to pass through the photovoltaic module 1 in the first portion 7 of the envelope 5. Following the removal step E4, the envelope 5 is described as having free lateral edges, notably edges through which the abrasive wire can pass. The step E2-1 of cutting the first portion 7 of the envelope 5, and more generally the separation step E2, is implemented after the removal step E4. Thus, said abrasive wire 12 can pass through the lateral edges, which are also referred to as freed lateral edges, of the first portion 7 of the envelope 5 optionally as they have been able to be modified by the removal step E4. The result is that the first protective element 2 is modified before the step E2-1 of cutting the first portion 7 of the envelope 5 such that said first protective element 2 does not interfere with the cutting operation. Thus, during the cutting step E2-1, the abrasive wire 12 remains at a distance from the first protective element 2. It is therefore understood that there is a need to develop an effective solution allowing this removal operation to be implemented.

According to a first embodiment of the step E4 of removing the rims 9a, 9b, 9c, 9d, an entire peripheral edge 1a of the photovoltaic module 1 can be removed (FIGS. 15 and 16), said peripheral edge 1a comprising the contour 11 of the first protective element 2, a peripheral edge 19 of the envelope 5, and a peripheral edge 20 of the second protective element 3. This first embodiment of the removal step E4 can be implemented by cutting by using, i.e. by, a beam 21a of energetic particles originating from a cutting head 21 forming a notch 22 along the entire thickness of the photovoltaic module 1 following the dotted lines indicated in FIGS. 3 and 15 on a free face of the first protective element 2 (notably the rear face of the photovoltaic module 1). This first embodiment of the removal step E4 has the disadvantage that the materials contained in the peripheral edge 1a of the photovoltaic module 1 as removed will only be recycled with difficulty, if at all; moreover there is also a risk of breaking the remaining portion of the second protective element 3 which can be a panel which may notably be made from glass or glass-based, which will no longer be able to be reused as is.

In the present description, a beam of energetic particles originating from a cutting head can cut the photovoltaic module, notably the material of the envelope 5. The beam of energetic particles is concentrated to allow a corresponding removal of material. According to one embodiment, the beam 21a of energetic particles is a laser beam, and the energetic particles are photons. The laser beam can be assisted by a water jet whose role is to guide the laser beam in order for it to be cylindrical and not conical. According to another embodiment, the beam 21a of energetic particles is an abrasive water jet, the particles of the beam in this case comprising particles (also referred to as molecules) of water and abrasive particles (notably made from SiC, corundum, for example natural corundum, or formed from garnet sand). Preferably, the abrasive particles of the water jet have a high hardness (a Mohs hardness higher than 8) and a grain size making it possible to adapt to the needs of the removal step E4. These abrasive particles of the water jet are propelled by the particles of water contained in the abrasive water jet such that the abrasive particles of the water jet have sufficient kinetic energy to carry out the desired removal of material. When the beam 21a is an abrasive water jet, the pressure of the abrasive water jet can be between 1000 bar and 8000 bar. The quantity of abrasive particles used in the abrasive water jet can be adapted according to requirements. Using the abrasive water jet as a beam 10 has the advantage that it does not provide heating-up, the advantage of limiting energy consumption, and is simpler to implement. The advantages of the laser beam are that it is more accurate, because it has a finer cutting line, and that it does not entail the reprocessing of contaminated liquid.

Figure 17:
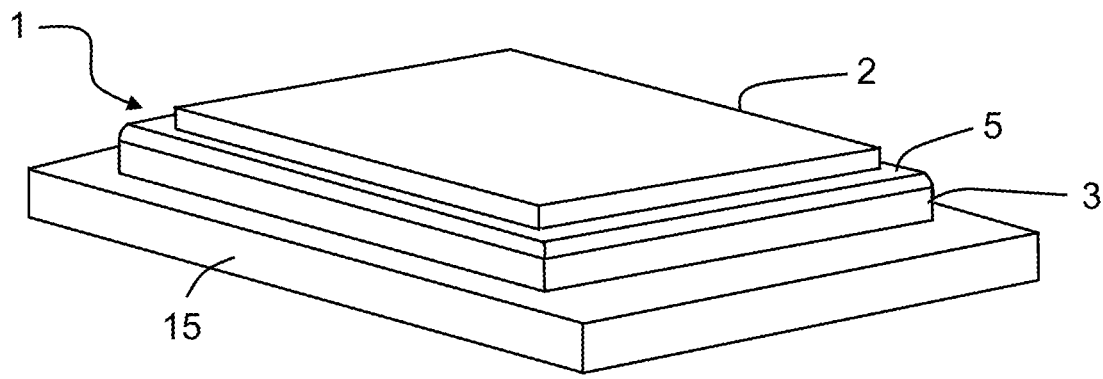

According to a second embodiment of the step E4 of removing the rims, the latter can be removed by mechanical machining, for example by using a router cutter, the result of which is that, by removing the rims 9a, 9b, 9c, 9d of FIG. 3, the result of FIG. 17 is produced, in which the first protective element 2 of the photovoltaic module 1 is free of its initially present rims, and forms a shoulder with the envelope 5. This embodiment is simple to implement, but generates polluting dust when the first protective element 2 comprises a fluorinated polymer.

Figure 15:
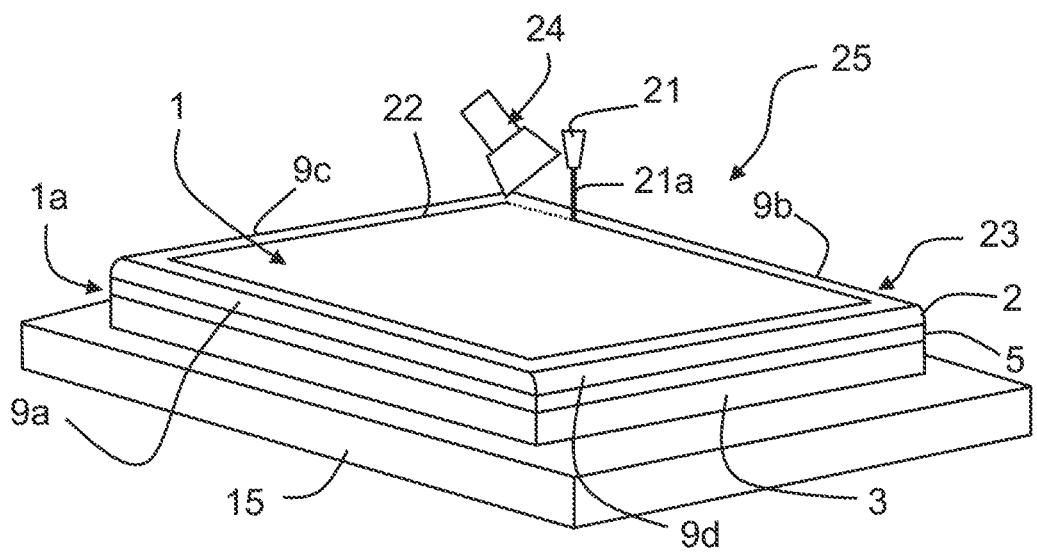
FIGS. 15 to 18 illustrate perspective views of different embodiments of a step of removing rims from a first protective element of the photovoltaic module.
Figure 16:
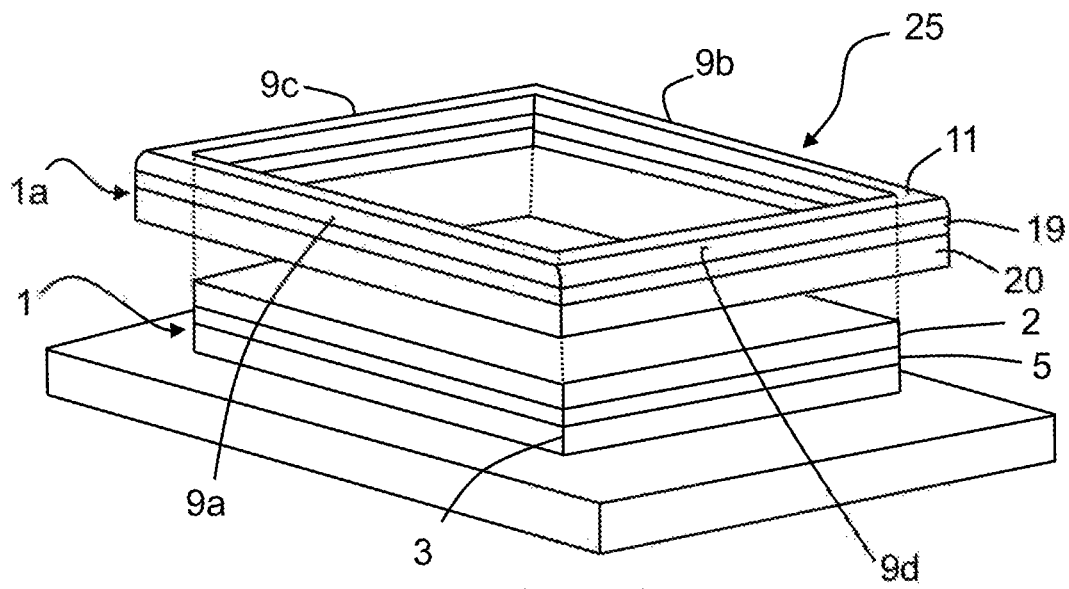
Figure 18:
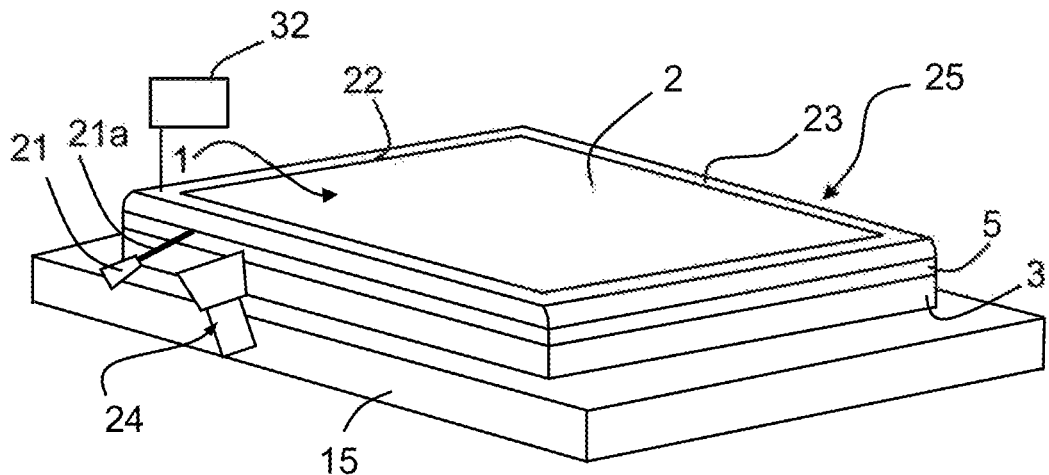

According to a third embodiment of the step E4 of removing the rims 9a, 9b, 9c, 9d, the removal step E4 comprises (FIGS. 5 and 15) a step E4-1 of forming a notch 22 in the photovoltaic module 1 from an outer face of the first protective element 2 so as to delimit a frame 23 comprising the rims 9a, 9b, 9c, 9d. In FIG. 15, the second protective element 3 is in contact with the support 15. The outer face of the first protective element 2 is, notably, oriented in a direction facing away from the photovoltaic cells 4. The outer face is, notably, the rear face of the photovoltaic module 1. Next, the removal step E4 comprises a step E4-2 (FIG. 18) of cutting into the lateral faces of the photovoltaic module 1 up to the notch 22 in order to detach the frame 23 from the photovoltaic module 1, which results in the photovoltaic module 1 according to FIG. 17 being obtained, in which, notably, the second protective element 3 is fixed to the support 15. In another version, the removal step E4 comprises a step E4-2 of cutting into the lateral faces of the photovoltaic module 1 up to the notch 22 in order to detach the frame 23 with respect to the rest of the photovoltaic module 1 and, notably, with respect to the envelope 5, i.e. with respect to the photovoltaic cells 4. After the cutting step E4-2, the removal step E4 can comprise a step E4-3 of taking off the frame 23.

This third embodiment of the removal step E4 helps limit the generation of polluting dusts, and optimize the recycling of the photovoltaic module 1. The step E4-1 of forming the notch 22 and the step E4-2 of cutting into the lateral faces of the photovoltaic module 1 can be carried out by a beam 21a of energetic particles originating from a cutting head 21 as described previously (FIGS. 15 and 18). The cutting head 21 is movable with respect to the photovoltaic module 1. The beam 21a is calibrated to cut to a desired notch 22 depth and/or at a suitable distance from the lateral faces of the photovoltaic module 1. Using such a cutting head 21 helps limit the increase in temperature of the first protective element 2 during the removal of the rims 9a, 9b, 9c, 9d, which helps limit the emission of pollutants when the first protective element 2 comprises a fluorinated polymer. The diameter or maximum transverse dimension of the beam of energetic particles can be between 50 µm and 300 µm, or, for example, between 20 µm and 100 µm, or can be equal to 100 µm, for the dimensions provided above for the thickness of the first portion 7 of the envelope 5, so as to preferentially cut only into the envelope 5 during the cutting step E4-2. Notably, the frame 23 is such that it has a width of one centimeter when viewed in the plane of the first protective element 2. The cutting head 21 can be automated, and suitable for moving according to a plurality of degrees of freedom, for example allowing the cutting head 21 to move along three orthogonal axes and, if required, to rotate about these orthogonal axes. In particular, the cutting head 21 can be carried by an articulated arm. According to one embodiment, it is possible to use several beams of energetic particles, each originating from a corresponding cutting head, to form the notch 22 and implement the cutting step E4-2.

Preferably, the step E4-2 of cutting into the lateral faces of the photovoltaic module 1 is carried out in the envelope 5 at, i.e. is close as possible to, the interface between the envelope 5 and the first protective element 2. The result is that the bottom of the notch 22 is located in the envelope 5. This has the advantage of avoiding the presence of residues from the removed rims 9a, 9b, 9c, 9d on the envelope 5 once the frame 23 has been removed.

The cutting step E4-2 can be calibrated depending on the type of photovoltaic module 1 such that the cutting head 21 always follows the same trajectory during cutting, this is possible if the shapes and dimensions of the photovoltaic module 1 are known. However, in certain cases, the photovoltaic module 1 can be deformed, or be of an unknown shape. There is therefore a need to guide the cutting head 21.

Thus, during the step E4-2 of cutting into the lateral faces of the photovoltaic module 1, the cutting head 21 can be guided by using data from a guiding system 24 (FIG. 18) comprising, for example an optical vision system or a material detector. The optical vision system can be of the camera type, and is capable of determining where the beam 21a of energetic particles from the cutting head 21 cooperates with the photovoltaic module 1 to adjust the trajectory of the cutting head 21. The material detector can comprise a durometer used to detect whether the material cut by the cutting head is the correct material, or to detect where to direct the beam, and adjust the trajectory of the cutting head 21, if necessary, to cut into the envelope 5 as close as possible to the first protective element 2. Alternatively, the material detector can implement laser-induced breakdown spectroscopy (the abbreviation of which is LIBS). The durometer has the advantage of functioning by contact, thus helping simplify the detection of material(s). The LIBS detector allows servo control indexed to a chemical composition, which is more costly to implement, but far more accurate than the durometer. Guiding the cutting head 21 is advantageous for the cut to be as clean as possible, limiting the presence of residues from the rims 9a, 9b, 9c, 9d of the first protective element 2 on the envelope 5. The guiding system 24 can also be used to form the notch 22 (FIG. 15) insofar as it detects when the material of the envelope 5 is reached before moving the cutting head 21 during the formation of the notch 22. The guiding of the cutting head 21 is shown schematically by step E4-4 in FIG. 5.

During the cutting step E4-2, a force can be applied to the frame 23 so as to move it away from the photovoltaic cells 1. This helps facilitate the work of the cutting head 21 and, notably, prevent the frame 23 from sticking back onto the material of the envelope 5 if a laser is used to locally heat where cutting needs to be earned out. In other words, during the step E4-2 of cutting into the lateral faces of the photovoltaic module 1, an action can be exerted on the frame 23 by a gripping member so as to move said frame 23 away from the photovoltaic cells 4.

The disassembly installation can comprise a modification station 25 for modifying the photovoltaic module 1 (FIGS. 15, 16, 18) before it enters the cutting station 16. The modification station 25 can comprise the means required to remove the rims 9a, 9b, 9c, 9d, notably the cutting head 21, which is capable of moving to allow the photovoltaic module 1 to be cut in order to remove the abovementioned rims 9a, 9b, 9c, 9d and, if appropriate, the gripping member 32 (FIG. 18) allowing the action to be exerted on the frame 23.

Figure 19:
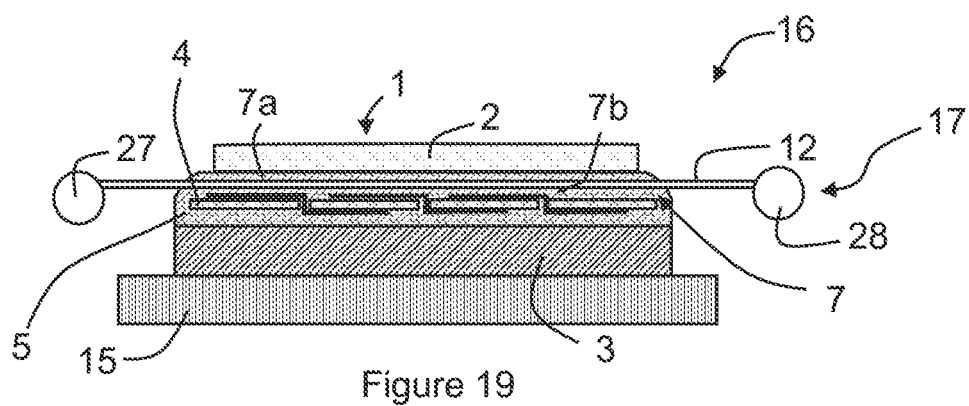
FIGS. 19 to 21 illustrate cross section views of the photovoltaic module according to its second embodiment in a cutting station displaying different embodiments of a cutting step or steps.
Figure 20:
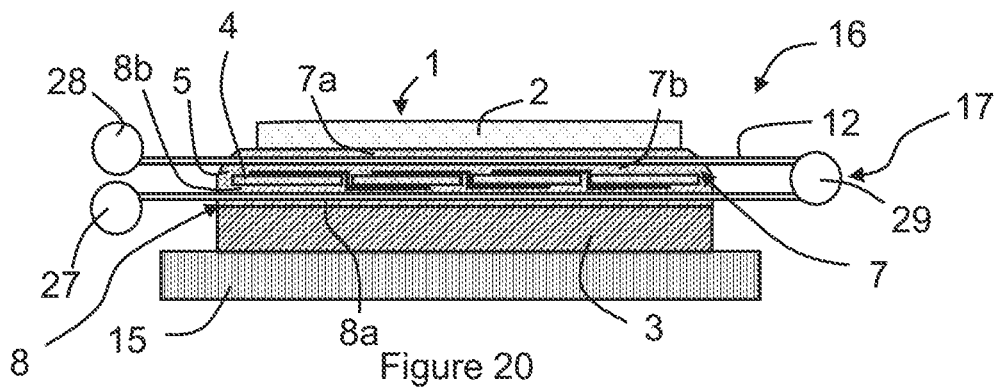
Figure 21:
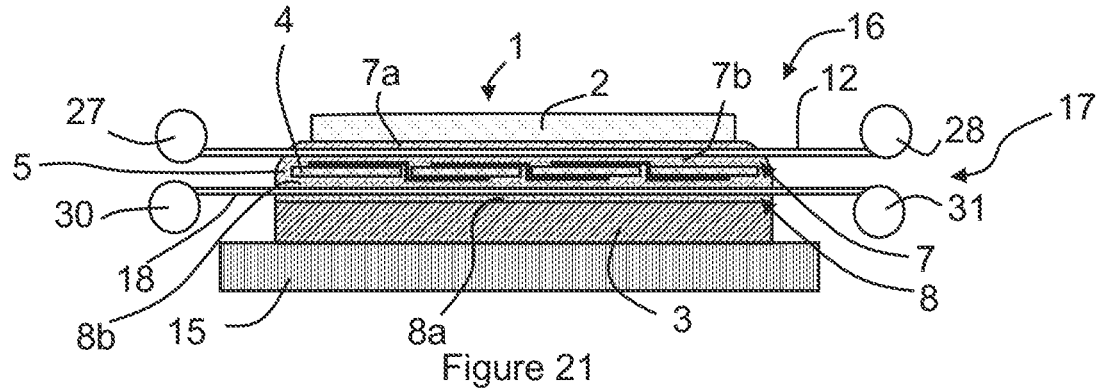
Figure 22:
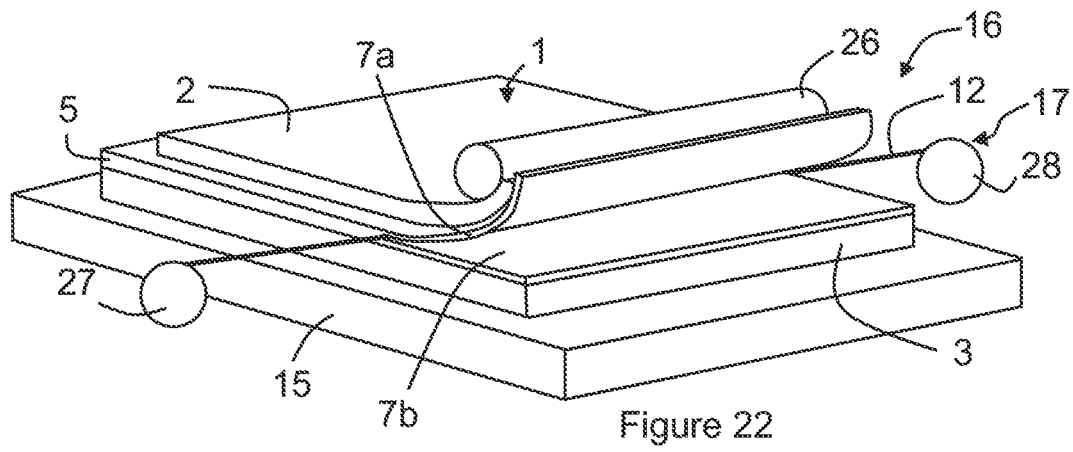
FIG. 22 illustrates a perspective view of the separation of the first protective element with respect to the rest of the photovoltaic module by winding.

After the step E4 of removing the rims 9a, 9b, 9c, 9d, the cutting step E2-1 and/or the cutting step E3-1 as described above can be implemented on the photovoltaic module 1 free of the rims 9a, 9b, 9c, 9d as illustrated in FIGS. 19 to 22. FIGS. 19 to 21 illustrate the step E2-1 of cutting the first portion 7 of the envelope 5 by means of the abrasive wire 12. FIG. 20 shows the cutting of the second portion 8 of the envelope 5 by means of the abrasive wire 12, and FIG. 21 shows the cutting of the second portion 8 of the envelope 5 by means of the additional abrasive wire 18.

Thus, in order for the cutting step E2-1 and/or the cutting step E3-1 to be effective, the abrasive wire or wires used preferably cut only through the envelope 5, if appropriate through the first portion 7 of the envelope 5 and/or through the second portion 8 of the envelope 5.

Generally, the disassembly method can comprise a step E5 (FIG. 5) of cooling the photovoltaic module 1. Notably, the cutting step E2-1 and/or the cutting step E3-1 and/or the step E4 of removing the rims are carried out when the photovoltaic module 1 is cooled, i.e. during the cooling step E5. This cooling helps harden the envelope 5 to make it easier to cut, for example using one or more abrasive wires. The cooling can be provided by a cooling unit, by Peltier effect or by another system allowing the desired result to be obtained. Moreover, cooling also helps prevent the cut portions from sticking back together after being passed through by the abrasive wire or wires or, if appropriate the beam of energetic particles. Thus, the cooling step E5 can be such that it keeps the temperature of the photovoltaic module 1 between −100° C. and 10° C.

Alternatively, or in combination with the cooling, any type of means which makes it possible, as the abrasive wire 12 passes through, to prevent the elements to be separated from the photovoltaic module 1 from sticking back on, can be used. For example, such means can comprise a compressed air injector or even a spacing device that tends to move apart the elements of the photovoltaic module 1 that are to be separated. Thus, the separation step E2 can comprise a step E2-2 (FIGS. 5 and 22) of applying a force to the first protective element 2 with a spacing device 2 so as, to gradually move said first protective element 2 away from the photovoltaic cells 4 as the abrasive wire 12 progresses through the first portion 7 of the envelope 5 during the step E2-1 of cutting this first portion 7 of, the envelope 5. According to another version, the separation step E2 can comprise a step E2-2 (FIGS. 5 and 22) of applying a force to the first protective element 2, for example with a spacing device 26, said force application step E2-2 gradually moving said first protective element 2 away from the photovoltaic cells 4, during the step E2-1 of cutting said first portion 7 of the envelope 5, as the abrasive wire 12 progresses through the first portion 7 of the envelope 5. A cylinder provided with a gripper can form the spacing device 26 onto which the first protective element 2 is wound. In this instance, the cylinder is capable of rotating about itself and moving in translation orthogonally to the direction of cutting by the abrasive wire 12 to allow the first protective element 2 to be wound up suitably. The same principle can be applied during the cutting step E3 insofar as the photovoltaic cells 4 can be moved away (step E3-2 shown in FIG. 5) from the second protective element 3 to prevent parts cut off the second portion of the envelope from sticking back on.

One of toe first and second protective elements 2, 3 is preferably held flat during the implementation of the cutting step E2-1 and/or the cutting step E3-1. To implement this holding action, the support 15 mentioned above can comprise an adhesive, a vacuum suction system, or even a mechanical holding system helping, if appropriate, to hold toe first protective element 2 (FIGS. 6, 7, 8 to 12) or the second protective element 3 (FIGS. 19 to 22), against the support 15, thus rectifying any potential warping of the photovoltaic module 1. Holding one of the first and second protective elements 2, 3 flat helps facilitate cutting by means of the abrasive wire or wires so as to ensure that this cutting takes place only in the material of the envelope 5, by tending to flatten toe first and second portions 7, 8 of toe envelope 5 to be cut. Thus, in the context of the installation, it can comprise the support 15 configured to hold one of the first and second protective elements 2, 3 when cutting the first portion 7 of toe envelope 5 by means of the abrasive wire 12 of the cutting tool 17, the same also applying, if appropriate, to step E3-1.

Preferably, the first protective element 2 or the second protective element 3 positioned against the support 15 is a panel which is, notably, made from glass or glass-based. The advantage is that the panel is flat and smooth, thus helping set the height of the abrasive wire or wires suitably to carry out cutting according to the cutting step E2-1 and/or toe cutting step E3-1. According to the second embodiment of the photovoltaic module 1, the second protective element 3 is positioned against the support 15 for the reason mentioned above, and because the first protective element 2 has flexibility such that it has been modelled during the previously disclosed rolling operation: this first protective element 2 is therefore not necessarily flat.

In a manner applicable to all that has been described previously, the cutting step E2-1 is such that, when completed, a first part 7a of the first portion 7 of the envelope 5 remains integral with the first protective element 2 and a second part 7b of the first portion 7 of the envelope 5 remains integral with the photovoltaic cells 4 (FIGS. 7, 10, 12, 14, 19 to 22). Moreover, the cutting step E3-1 is such that, when completed, a first part 8a of the second portion 8 of the envelope 5 remains integral with the second protective element 3, and a second part 8b of the second portion 8 of the envelope 5 remains integral with the photovoltaic cells 4 (FIGS. 10, 12, 20, 21). The presence of these first and second parts, which may be in the form of layers, for example, helps ensure that cutting using the abrasive wire or wires does not damage the photovoltaic cells 4 or the first and second protective elements 2, 3, in order to facilitate the subsequent recycling of same.

Each abrasive wire 12, 18 used to help disassemble the photovoltaic module can have a diameter strictly smaller than the separation distance between the first protective element 2 and the photovoltaic cells 4 or, if appropriate, between the second protective element 3 and the photovoltaic cells 4, such that the abrasive wire only cuts the encapsulating material belonging to the envelope 5. In view of the thickness ranges set out above for the first and second portions 7, 8, it is preferable, for the abrasive wire 12 and if appropriate the additional abrasive wire 18, for the diameter of the support wire carrying the abrasive particles of the abrasive wire to be between 40 μm and 200 μm, preferably between 100 μm and 180 μm, and ideally of the order of 150 μm. In order for the abrasive wire 12, 18 to cut the envelope 5 quickly, the abrasive particles of the abrasive wire are preferably large. The size of the abrasive particles used to form the abrasive wire 12 and/or the additional abrasive wire 18 depends on the diameter of the support wire that is to carry them. Therefore, for example, the size of the abrasive particles of the abrasive wire can be between 10 μm and 50 μm, and preferably between 30 μm and 40 μm for a support wire with a diameter equal to 150 μm. According to a specific example, the support wire 13 has a diameter of 180 μm and the abrasive particles 14, which are notably made from diamond, each have a size of between 30 μm and 40 μm, this specific example helps limit the extent to which the EVA sticks back to itself as the abrasive wire 12 passes through, notably in comparison with a 120 μm support wire. According to this specific example, the support wire 13 having a diameter of 180 μm can be made from steel and the abrasive particles 14 can be formed by diamonds, each having a size of between 30 μm and 40 μm, such an abrasive wire 12 has the following advantages: it allows quick cutting; it can be highly tensioned during cutting, for example to 40 N, in order to accurately control the trajectory of the abrasive wire; it prevents the EVA from sticking back to itself after the abrasive wire has passed through; it makes it possible to remove approximately 250 μm of material, which can be particularly suitable when the thickness of the portion of the envelope through which the abrasive wire must pass is approximately 300 μm: because a satisfactory thickness of the envelope is therefore removed during the corresponding cutting operation. This specific example can also be applied to the additional wire. The size of an abrasive particle can be considered to be its diameter.

Generally, in order to carry out cutting using an abrasive wire in the context of the present invention, the cutting tool 17, notably belonging to the cutting station 16 described above, comprises first and second reels 27, 28 (FIGS. 6, 7, 9, 10, 11, 12, 13, 14 and 19 to 22), notably respectively referred to as the feed reel and the take-up reel in the field. The cutting tool 17 is configured to set the abrasive wire 12 in motion such that it makes to-and-fro movements to cut the portion in question of the envelope 5. When the cutting steps E2-1 and E3-1 are carried out by the same abrasive wire, a deflection pulley 29 deflecting the abrasive wire 12 between the first and second reels 27, 28 can be used (FIGS. 9, 10 and 20). If an additional abrasive wire 18 is used for the cutting step E3-1, the same principle applies: associating said additional abrasive wire 18 with first and second additional reels 30, 31 (FIGS. 11,12 and 21).

According to a specific embodiment of the cutting tool 17, the abrasive wire 12 makes reciprocating movements between the first reel 27 and the second reel 28 in such a way that, each time the abrasive wire 12 returns towards the first reel, the distance wound in by the first reel 27 is strictly less than the distance unwound by the first reel 27 in the outward movement. This advantageously helps improve the service life of the abrasive wire 12 by renewing a longitudinal portion of the latter at each reciprocating movement. It is thus possible, for each reciprocating movement, to unwind from the feed reel between 100 m and 1500 m, preferably between 500 m and 1000 m, and ideally between 600 m and 800 m of abrasive wire and, for example, to wind back into the take-up reel only 99.1%, or between 95% and 99%, of the unwound length. The linear speed of the abrasive wire 12 can vary from 10 m/s to 30 m/s during cutting. If appropriate, the same principle can be applied to the first and second reels 30, 31 associated with the additional abrasive wire 18.

Everything that has been described in the context of the disassembly method can be applied in the context of the disassembly installation, and vice versa. Notably, the disassembly installation comprises the hardware and, if appropriate, software means, for implementing the disassembly method.

The method and the installation described above are industrially applicable in the context of the disassembly of one or more photovoltaic modules in order to recycle their constituents. Indeed, if appropriate, it is then possible to recover the glass whole if it has not broken, to recover the material comprising the fluorinated polymer, and to recover the active elements of the photovoltaic module such as the photovoltaic cells, which could be reused. This therefore makes it possible, notably, to:

reuse glass panels in the production of new photovoltaic modules, treat the fluorinated compounds, if present in the first protective element, in a specialized toxic-materials department, recover the metals contained in the photovoltaic cells such as silicon, silver, aluminum or indium.

The invention claimed is:

1. A method for disassembling a photovoltaic module comprising:
   a first protective element comprising a backsheet,
   a second protective element,
   photovoltaic cells that are located between the first protective element and the second protective element,
   an envelope in which the photovoltaic cells are encapsulated, said envelope linking the first protective element to the second protective element and comprising:
      a first portion that is located between the photovoltaic cells and the first protective element, and
      a second portion that is located between the photovoltaic cells and the second protective element,
   said disassembly method comprising:
      a step of separating the photovoltaic cells with respect to the first protective element, the step of separating the photovoltaic cells with respect to the first protective element comprising a step of cutting the first portion of the envelope using an abrasive wire, wherein
   the step of cutting the first portion of the envelope using the abrasive wire is carried out in dry conditions,
   the first protective element comprises rims in contact with lateral edges of the first portion of the envelope,
   the disassembly method comprises a step of removing the rims from the first protective element, the step of cutting the first portion of the envelope being implemented after the step of removing the rims, and
   the step of removing the rims comprises:
      a step of forming a notch in a top surface of the first protective element strictly interior to the lateral edges of the first protective element so as to delimit a frame comprising the rims, and
      a step of cutting into the photovoltaic module at the notch strictly interior to the lateral edges in order to detach the frame as a unitary member from the photovoltaic module.

2. The disassembly method according to claim 1, comprising a step of separating the photovoltaic cells with respect to the second protective element, comprising a step of cutting the second portion of the envelope.

3. The disassembly method according to claim 2, wherein the step of cutting the second portion of the envelope is implemented by said abrasive wire or by an additional abrasive wire.

4. The disassembly method according to claim 1, wherein the step of forming the notch and the step of cutting into the photovoltaic module are carried out by a beam of energetic particles originating from a cutting head.

5. The disassembly method according to claim 4, wherein during the step of cutting into the photovoltaic module, the cutting head is guided by using data from a guiding system comprising an optical vision system, or a material detector.

6. The disassembly method according to claim 1, wherein during the step of cutting into the photovoltaic module, an action is exerted on the frame by a gripping member so as to move said frame away from the photovoltaic cells.

7. The disassembly method according to claim 1, wherein the step of separating the photovoltaic cells with respect to the first protective element comprises a step of applying a force to the first protective element, said step of applying the force gradually moving said first protective element away from the photovoltaic cells, during the step of cutting said first portion of the envelope, as the abrasive wire progresses through the first portion of the envelope.

8. The disassembly method according to claim 1, comprising a step of cooling the photovoltaic module, wherein the step of cutting the first portion of the envelope using the abrasive wire is carried out during the step of cooling the photovoltaic module.

9. The disassembly method according to claim 1, wherein one of the first and second protective elements is held flat during the implementation of the step of cutting the first portion of the envelope.

10. The disassembly method according to claim 1, wherein the abrasive wire comprises a support wire to which abrasive particles are fixed.

11. The disassembly method according to claim 10, wherein a diameter of the support wire is between 40 μm and 200 μm and/or in that a size of the abrasive particles is between 10 μm and 50 μm.

12. The disassembly method according to claim 10, wherein the support wire has a diameter of 180 μm and the abrasive particles, which are notably made from diamond, each have a size of between 30 μm and 40 μm.

13. The disassembly method according to claim 10, wherein a diameter of the support wire is between 100 μm and 1800 μm, and/or in that a size of the abrasive particles is between 10 μm and 50 μm.

14. The disassembly method according to claim 1, comprising:
a step of separating the photovoltaic cells with respect to the second protective element, the step of separating the photovoltaic cells with respect to the second protective element comprising a step of cutting the second portion of the envelope using the abrasive wire, wherein the step of cutting the second portion of the envelope using the abrasive wire is carried out in dry conditions.

15. The disassembly method according to claim 1, comprising conducting the step of cutting the first portion and the step of cutting the second portion at the same time.

16. The disassembly method according to claim 1, comprising cutting the first portion and cutting the second portion each using the abrasive wire at the same time.

17. The disassembly method according to claim 1, comprising forming the notch along plural ones of the lateral edges before performing the step of cutting into the lateral faces of the photovoltaic module up to at the notch.

18. A method for disassembling a photovoltaic module comprising:
a first protective element comprising a backsheet,
a second protective element,
photovoltaic cells that are located between the first protective element and the second protective element,
an envelope in which the photovoltaic cells are encapsulated, said envelope linking the first protective element to the second protective element and comprising:
a first portion that is located between the photovoltaic cells and the first protective element, and
a second portion that is located between the photovoltaic cells and the second protective element,
said disassembly method comprising:
a step of separating the photovoltaic cells with respect to the first protective element, the step of separating the photovoltaic cells with respect to the first protective element comprising a step of cutting the first portion of the envelope using an abrasive wire, wherein
the step of cutting the first portion of the envelope using the abrasive wire is carried out in dry conditions,
the disassembly method comprises:
a step of forming a notch in a top surface of the first protective element to delimit a frame, the notch having a bottom surface in the envelope, and
a step of cutting into lateral sides of the photovoltaic module at an interface between the first protective element and the envelope or in the envelope to reach the notch, to detach the frame from the photovoltaic module.

* * * * *